United States Patent
Pio (10) Patent No.: US 6,668,303 B2
(45) Date of Patent: Dec. 23, 2003

(54) METHOD FOR REFRESHING STORED DATA IN AN ELECTRICALLY ERASABLE AND PROGRAMMABLE NON-VOLATILE MEMORY

(75) Inventor: Federico Pio, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/057,768

(22) Filed: Jan. 24, 2002

(65) Prior Publication Data

US 2002/0116592 A1 Aug. 22, 2002

(30) Foreign Application Priority Data

Feb. 19, 2001 (EP) ............................. 01830110

(51) Int. Cl.[7] ........................... G06F 12/00; G11C 16/34
(52) U.S. Cl. .................. 711/103; 711/106; 365/185.33; 365/185.02; 365/185.12; 365/222
(58) Field of Search ................................ 711/103, 106; 365/185.29, 185.12, 185.33, 185.05, 222

(56) References Cited

U.S. PATENT DOCUMENTS

| | | | |
|---|---|---|---|
| 5,239,505 A | * 8/1993 | Fazio et al. | |
| 5,574,684 A | * 11/1996 | Tomoeda | 365/185.04 |
| 5,652,720 A | * 7/1997 | Aulus et al. | 365/185.09 |
| 5,765,185 A | * 6/1998 | Lambrache et al. | 711/103 |
| 6,026,024 A | * 2/2000 | Odani et al. | 365/185.22 |
| 6,108,241 A | * 8/2000 | Chevallier | 365/185.33 |
| 6,166,959 A | * 12/2000 | Gupta et al. | 365/185.25 |
| 6,493,270 B2 | * 12/2002 | Chevallier | 365/185.33 |
| 2002/0149986 A1 | * 10/2002 | Wong | 365/222 |

FOREIGN PATENT DOCUMENTS

| | | |
|---|---|---|
| EP | 0 718 849 | 6/1996 |
| WO | 00/16338 | 3/2000 |

OTHER PUBLICATIONS

Shigeru Atsumi et al. "A 16 MB Flash EEPROM with a new self–data–refresh scheme for a sector erase operation" IEICE Transactions of Electronics. 1 May 1994.*

Shigeru Atsumi et al.; "A 16–Mb Flash EEPROM with a New Self–Data–Refresh Scheme for a Sector Erase Operation", vol. E77–C, No. 5 dated 1 May 1994, pp. 791–798, XP000459519.

* cited by examiner

Primary Examiner—Matthew Kim
Assistant Examiner—Matthew D. Anderson
(74) Attorney, Agent, or Firm—Lisa K. Jorgenson; Allen, Dyer, Doppelt, Milbrath & Gilchrist, P.A.

(57) ABSTRACT

Method for refreshing data stored in an electrically erasable and programmable non-volatile semiconductor memory including at least one two-dimensional array of memory cells containing a plurality of individually erasable and programmable memory pages. Each time a request to modify a content of a memory page is received by the memory, the method provides for modifying the content of said memory page and submitting a portion of the two-dimensional array to a refresh procedure. The refresh procedure includes detecting memory cells of that memory portion that have partially lost a respective datum stored therein and reprogramming the datum in the detected memory cells.

22 Claims, 7 Drawing Sheets

METHOD FOR REFRESHING STORED DATA IN AN ELECTRICALLY ERASABLE AND PROGRAMMABLE NON-VOLATILE MEMORY

BACKGROUND OF THE INVENTION

1. Field of the Invention

The present invention relates generally to the field of semiconductor memory devices, and more particularly to non-volatile memories. Still more particularly, the invention relates to electrically erasable and programmable non-volatile memories, such as Flash memories.

2. Background of the Invention

As known, in Flash non-volatile memories data are written (programmed) by means of hot electron injection into floating-gate electrodes (briefly, floating gates) of the memory cells. To erase data, electrons are extracted from the floating gates of the memory cells by means of the mechanism known as Fowler-Nordheim tunnelling at high electric fields, giving rise to a Fowler-Nordheim current.

In conventional Flash memories, only the whole two-dimensional array (also called matrix) of memory cells or, where memory sectors are provided, only a whole memory sector can be erased at a time. All the memory cells of the matrix or memory sector to be erased are submitted to an erase voltage $$V_{GB} = V_G - V_B$$

where $V_G$ is for example a negative voltage (e.g., ranging from −8V to −9V) applied simultaneously to all the rows (word lines) of the matrix or memory sector, that is, to the memory cells' control-gate electrode (briefly, control gate), and $V_B$ is a positive voltage (e.g., ranging from 8V to 9V) applied to the common substrate or bulk electrode of the memory cells of the matrix or memory sector are formed. Starting from an initial value, the erase voltage is progressively increased (in absolute value) until by progressive extraction of electrons from the floating gates of the threshold voltage of all the memory cells is brought below a prescribed reference value, chosen to assure a proper margin compared to the standard memory read conditions.

The global character of the erase operation is a significant disadvantage of conventional Flash memories. In fact, even if memory sectors are provided, the minimum memory sector size that can be practically achieved, at a reasonable cost in terms of semiconductor chip area, is of some Kbytes. This means that when even a single data Byte or word belonging to a given memory sector is to be modified, the whole memory sector, that is some Kbytes of memory space, must be erased and then rewritten.

This limits the otherwise highly desirable use of Flash memories in those applications which require often to modify single data Bytes or words.

As a solution to this problem, it could be envisaged that in an erase operation only one word line (more generally, only a subset of the set of word lines making up the memory matrix or sector) is biased to a negative voltage $V_{selG}$ of, e.g., −8 V to −9 V, while the remaining word lines of the matrix or memory sector are biased to an erase inhibition voltage $V_{deselG}$ equal to ground or, preferably, intermediate between ground and the voltage $V_B$. In this way, only the memory cells belonging to the selected word line(s) are submitted to the erase voltage $V_{GB}$, while for the memory cells belonging to the non-selected word lines the electric field across the gate oxide thereof is substantially reduced not to trigger the Fowler-Nordheim tunneling.

As a result of the above solution, which requires a suitable modification of the conventional row address decoder and row selection circuits, the Flash memory can have a finer granularity in erasing, equal to one word line (or a subset of word lines). Defining as "memory page" the elementary memory unit that can be individually erased, that is, one word line (or a subset of word lines), the memory device can be called "Page Erasable ROM" or "PEROM".

A problem affecting the PEROM is that, when a memory page is to be erased, the memory cells not belonging to that memory page but however belonging to the same memory sector (or to the memory matrix if no memory sectors are provided with) are disturbed. In fact, even if the gate-bulk voltage ($V_{deselG} - V_B$) to which such memory cells are subjected is not sufficient to erase them, such a voltage is however favorable to the extraction of electrons from the floating gates thereof, and thus to a small reduction of the threshold voltages. Considering that any given memory page can be erased and rewritten many thousands of times, some memory cells, even if not belonging to the word lines selected for erasure, may at a given time lose the datum stored therein.

SUMMARY OF THE INVENTION

In view of the state of the art described, it is an object of the present invention to provide a method of refreshing the datum stored in each memory cell, so as to avoid spurious erasure thereof caused by disturbances induced thereon during the erase operations on other memory cells.

According to the present invention, these and other objects are achieved by a method for refreshing data stored in an electrically erasable and programmable non-volatile semiconductor memory comprising at least one two-dimensional array of memory cells containing a plurality of individually erasable and programmable memory pages, providing for:

each time a request to modify a content of a memory page is received by the memory, modifying the content of said memory page and submitting a portion of the two-dimensional array to a refresh procedure, the refresh procedure comprising detecting memory cells of that memory portion that have partially lost a respective datum stored therein and reprogramming the datum in the detected memory cells.

As a result of the method according to the invention, it is assured that all the memory cells are periodically subjected to a data refresh procedure preventing the data stored therein to get lost due to disturbances induced on such memory cells during erase operations on different memory cells of the memory matrix or of the same memory sector. Such a refresh operation is substantially transparent for the user, since it can be carried out each time a request to modify a memory page is received by the memory, preferably after completion of this operation.

BRIEF DESCRIPTION OF THE DRAWINGS

The features and advantages of the present invention will be made apparent by the following detailed description of some possible practical embodiments thereof, illustrated merely by way of non-limiting examples in the annexed drawings, wherein.

DETAILED DESCRIPTION

Figure 1:
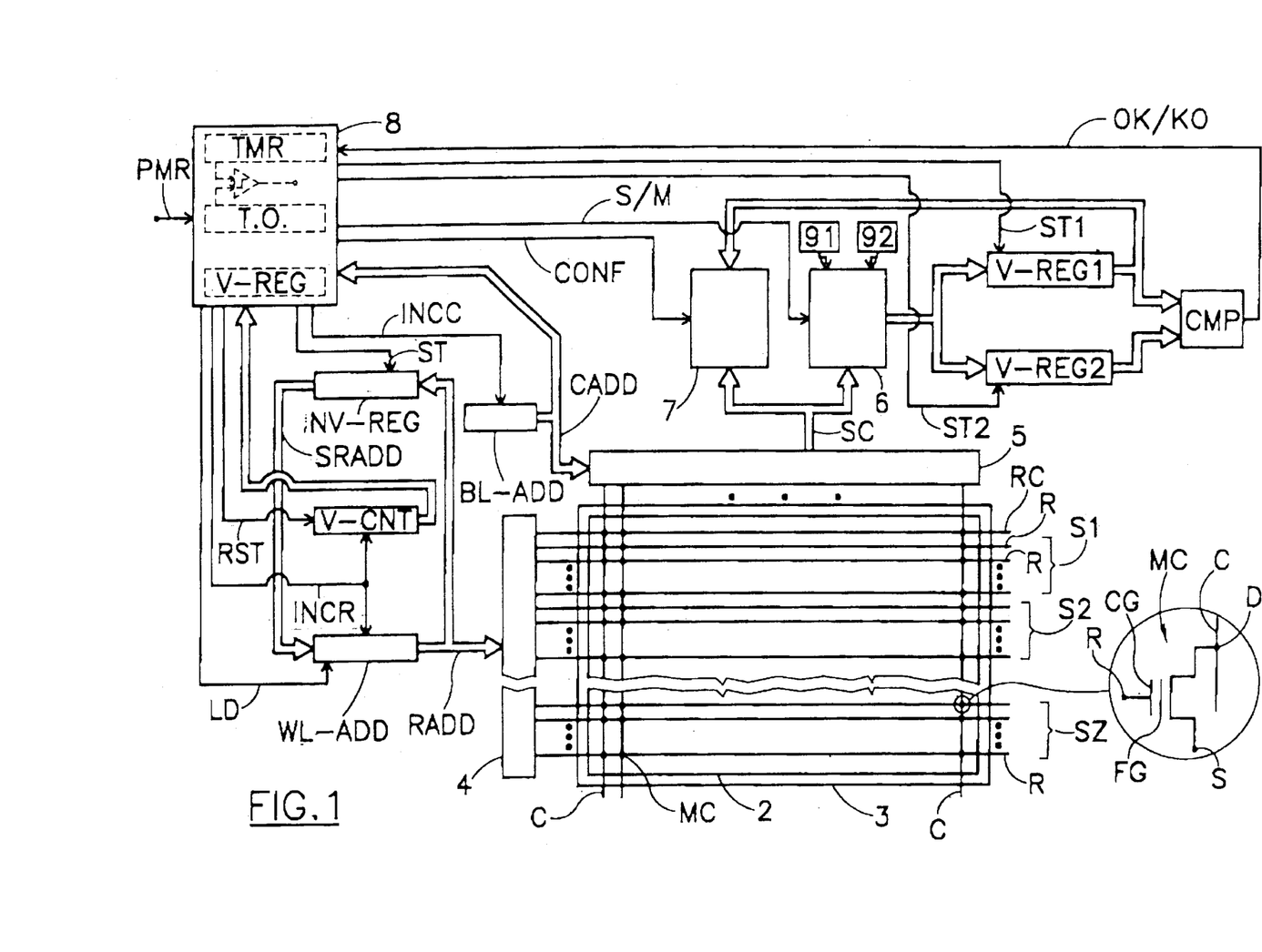
FIG. 1 is a schematic block diagram of a Page Erasable ROM (PEROM) suitable for implementing a method according to the present invention.

With reference to the drawings, FIG. 1 shows a schematic block diagram of a Flash memory adapted for implementing the method according to the invention.

The memory comprises one or, more generally, a plurality of two-dimensional arrays 1 of memory cells MC, only one of which is depicted for simplicity. Each two-dimensional array 1 of memory cells forms a memory sector. In the two-dimensional array 1 the memory cells MC are arranged in rows (word lines) R and columns (bit lines) C. At each intersection between a row R and a column C, a memory cell MC is provided. The memory cells MC are conventionally formed by stacked-gate MOS transistors with a control gate electrode (briefly, control gate) CG connected to the respective row, an electrically insulated floating gate electrode (briefly, floating gate) FG, a drain electrode (briefly, drain) D connected to the respective column, and a source electrode (briefly, source) S.

The memory cells MC are formed inside a semiconductor region 2 doped of a first, for example P, conductivity type, formed inside an N type doped semiconductor well 3 which in turn is formed inside a P type semiconductor chip.

A row address decoder and row selection circuit 4 conventionally receives from a bus of address signal lines (not shown), carrying address signals externally supplied to the memory, row address signal lines. Circuit 4 decodes a digital code carried by the row address signal lines and selects, among the plurality of rows R, one row corresponding to the digital code, providing the required bias voltage, that depends on the memory operation mode, to both the selected row and the unselected rows.

Similarly, a column address decoder and column selection circuit 5 conventionally receives from the bus of address signal lines column address signal lines CADD. Through circuit 5, a selected group SC of, e.g., eight or sixteen columns, depending on the degree of parallelism of the memory, can be selectively electrically coupled to a sensing circuitry 6, including conventional sense amplifiers, or to a programming circuitry 7. The sensing circuitry 6 and the programming circuitry 7 are per-se conventional and are therefore not described in greater detail.

In read and program operation modes, circuit 4 conventionally selects one word line R among the plurality of word lines of the two-dimensional array 1, biasing the selected word line to a word line read voltage or, respectively, a word line programming voltage. In read mode, circuit 5 couples the selected group SC of bit lines to the sensing circuitry 6, while in program mode the selected group SC of bit lines is coupled to the programming circuitry 7.

In erase operation mode, differently from a conventional Flash memory, circuit 4 is capable of selecting one addressed word line R (more generally, an addressed group of word lines) of the two-dimensional array 1, biasing the selected word line to a negative voltage $V_{selG}$ of, e.g., −8 V to −9 V, while the non-selected word lines are biased to an erase inhibition voltage $V_{deselG}$ equal to ground or, preferably, intermediate between ground and a biasing voltage $V_B$ of the N type well 3. All the bit lines C are conventionally left floating.

In this way, contrary to what happens in conventional Flash memories, only the memory cells MC belonging to the selected word line(s) R are submitted to the erase voltage $V_{GB}$, while for the memory cells belonging to the non-selected word lines the electric field across the gate oxide thereof is substantially reduced not to trigger the Fowler-Nordheim tunneling. The elemental memory unit which can be individually erased is also referred to as "memory page" or, briefly, "page".

In the following, it will be assumed for simplicity that a memory page coincides with a word line R of the two-dimensional array; this is not to be intended as a limitation of the invention, which is in general applicable independently of the number of word lines making up a memory page.

Still referring to FIG. 1, a word line address counter WL_ADD supplies circuit 4 with internally-generated row address signals RADD. Similarly, a bit line address counter BL_ADD supplies circuit 5 with internally-generated column address signals CADD; the content of the bit line address counter BL_ADD can be incremented under control of an increment signal INCC. The word line address counter WL_ADD can be loaded, under command of a load signal LD, with a row address code SRADD stored in a non-volatile register NV_REG. Correspondingly, the row address signals RADD generated by the word line address counter WL_ADD can be stored in a non-volatile way, under command of a store signal ST, in the non-volatile register NV_REG. A volatile register V_CNT is also provided to act as a counter, as will be better understood in the following. Volatile register V_CNT can be reset under command of a reset signal RST, and the content thereof can be incremented under command of an increment signal INCR which is also supplied to the word line address counter WL_ADD.

Signals LD, ST, RST, INCC and INCR are generated under control of a sequential logic circuit forming a state machine 8 governing the memory operation and, particularly, the execution of a data refresh procedure. In the context of this description, by data refresh procedure a procedure is meant by which memory cells are checked to determine whether programmed memory cells exist that have lost a certain amount of the charges trapped in the floating gates and, in the affirmative, such memory cells are reprogrammed to reinforce the data stored therein. The state machine 8 is responsive to a signal PMR which schematizes a request of data page modify received by the memory.

An output of the sensing circuitry 6 can be selectively stored in one of two volatile registers V_REG1, V_REG2, under control of respective store signals ST1, ST2 generated by the state machine 8. Volatile register V_REG1 is used to store the result of a "standard read" performed by the sensing circuitry, that is a sensing of the memory cells performed in standard read conditions. Volatile register V_REG2 is instead used to store the result of a "margin read", that is a sensing of the memory cells performed in deliberately worsened conditions compared to the standard read conditions. The meaning of standard read and margin read will be better explained later on.

In order to perform the standard read and the margin read, a standard reference quantity generator 91 and a margin reference quantity generator 92 are provided to supply to the sensing circuitry 6 a standard and, respectively, a margin reference quantities, for example a standard reference current and a margin reference current. A control signal S/M, generated by the state machine 8 and supplied to the sensing circuitry 6, determines the type of sensing to be performed.

The content of volatile registers V_REG1, V_REG2 is supplied to a logic comparator circuit CMP an output KO/OK of which is supplied to the state machine 8. An output of volatile register V_REG1 is also supplied to the programming circuitry 7. The programming circuitry 7 can be activated under the control of a signal CONF, generated by the state machine 8, to use the content of volatile register V_REG1 in order to reprogram memory cells which have partially lost the datum stored therein.

Figure 2:
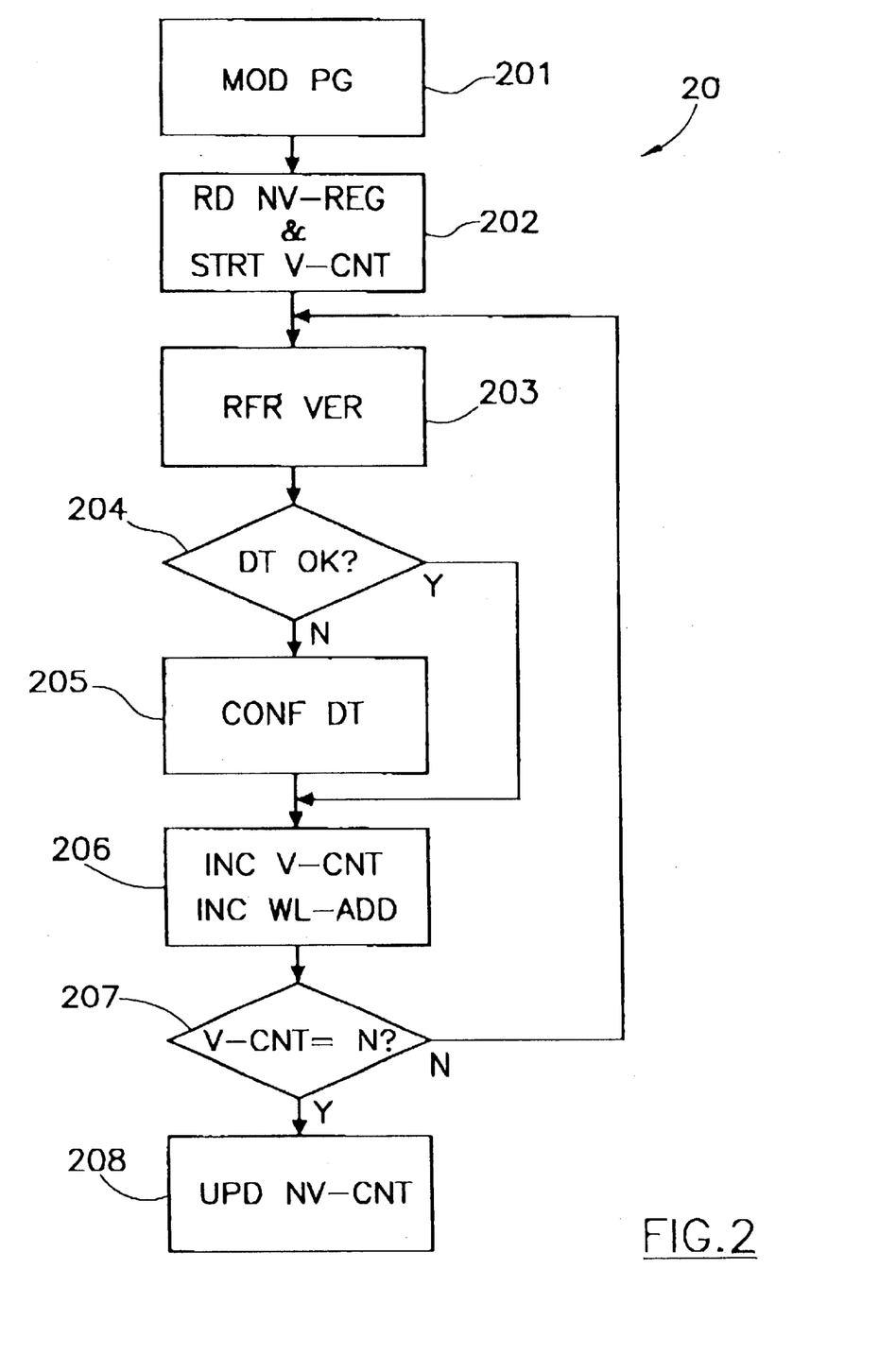
FIG. 2 is a flowchart schematically illustrating the method according to a first embodiment of the invention.

Referring now to FIG. 2, a flowchart is depicted illustrating a method 20 according to a first embodiment of the invention. A block 201 ("MOD PG") identifies a series of steps of an operation of modification of the content of an externally-addressed memory page (word line), briefly a date page modify operation. The steps include, for example, programming all the memory cells of the word line; applying in succession a number of erase voltage pulses to the word line until all the memory cells of the word line are brought into the erased state; verifying the presence of depleted memory cells (i.e., cells with a negative threshold voltage) in the word line and soft-programming the depleted memory cells; and writing the new data in the selected memory page.

Briefly, in this first embodiment of the invention the method provides for, in occasion of a data page modify operation and preferably at the end thereof, verifying the presence of soft-erased memory cells in a pre-selected number of word lines of the two-dimensional array: if soft-erased memory cells are encountered, the datum stored in each of them is properly reinforced.

More specifically, let M be the number of word lines R of the two-dimensional array 1 of memory cells MC, for example a memory sector of the memory; typically, $M=2^K$. The set of M word lines of the two-dimensional array is (ideally, not physically) subdivided in Z subsets S1–SZ of word lines (FIG. 1). Preferably, but this is not a limitation, each one of the Z subsets includes N word lines. Supposing as a mere example that $N=2^k$, then $Z=M/N=2^{(K-k)}$.

After each operation of modification of the content of an externally-addressed memory page, one of the Z subsets S1–SZ of N word lines of the two-dimensional array 1 is checked to detect the presence of soft-erased memory cells. This provides for performing, for each memory cell MC of each word line R of the subset under check, two read operations: independently of the order in which they are performed, one read operation is carried on in standard sensing conditions ("standard read") and the other read operation is carried on in deliberately more critical sensing conditions ("margin read").

Figure 2A:
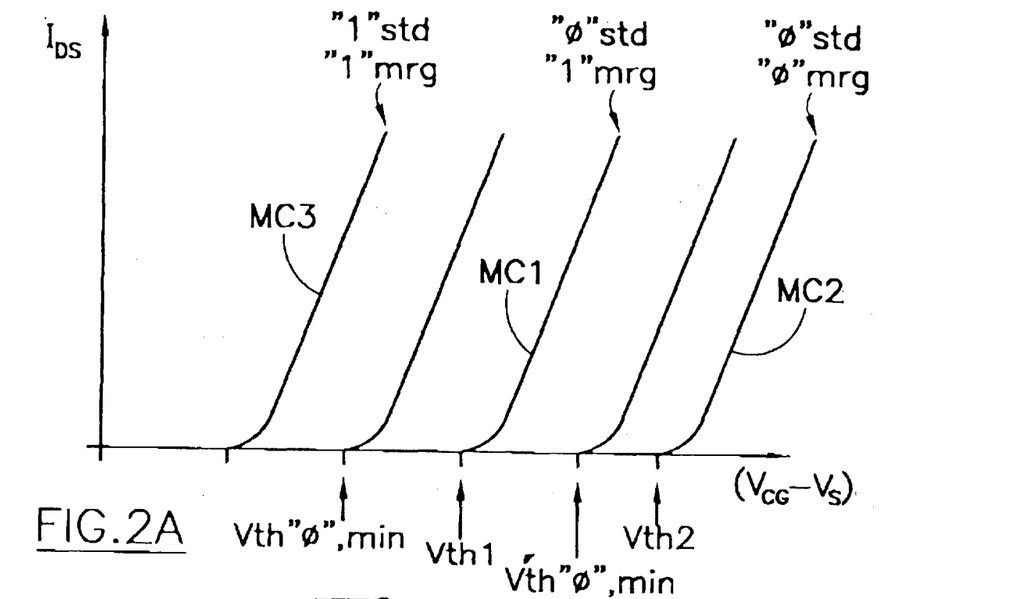
FIG. 2A shows in diagrammatic view current-voltage characteristics of different memory cells.

Referring to FIG. 2A (showing in diagrammatic view current-voltage characteristics of memory cells having different threshold voltages, in read conditions), more critical sensing conditions here means the following: for a memory cell to result programmed ("0") when read in standard sensing conditions, the threshold voltage $V_{th1}$ thereof must be higher than a minimum programmed threshold voltage $V_{th"0",min}$; for the same memory cell to be seen as programmed also in the more critical sensing conditions, the threshold voltage $V_{th2}$ thereof must be higher than a minimum programmed threshold voltage with margin $V'_{th"0",min}$, equal to $V_{th"0",min}+\Delta V_{th}$ ($\Delta V_{th}>0V$).

If a given memory cell is read as programmed both in the standard read and in the margin read (MC2 in FIG. 2A), it is assumed that the datum stored therein (conventionally, a logic "0") is still sufficiently strong and does not require to be reinforced.

If differently a memory cell is read as programmed in the standard read (MC1 in FIG. 2A), but not in the margin read, it is assumed that the memory cell has been "soft-erased". In the context of this description, soft-erasure means a partial loss of the charge trapped in the floating gate FG of the memory cell, caused for example by disturbances induced on that memory cell during erasure of other memory cells of the two-dimensional array 1, which determines a slight decrease of the memory cell threshold voltage. A soft-erased memory cell (MC1 in FIG. 2A), even if still providing a correct result when read in standard read, is a potential cause of errors: a further slight loss of floating gate charges could bring the threshold voltage of the memory cell too close or even below the minimum programmed threshold voltage $V_{th"0",min}$. The datum stored in such a memory cell is therefore considered no more sufficiently strong and must be reinforced.

Memory cells read as non-programmed both in the standard read and in the margin read (MC3 in FIG. 2A) are assumed to be real non-programmed memory cells, storing conventionally a logic "1". A situation in which a memory cell is read as programmed in the standard read but non-programmed in the margin read is not consistent and indicates some kind of malfunctioning.

For example, the sensing conditions adopted for the margin read can be those used in the program verify step of a program operation.

Referring again to FIG. 2, block 202 ("RD NV_REG & STRT V_CNT"), in the non-volatile register NV-CNT provided in the memory device, information is stored which is representative of an address of the last word line R which has been submitted to the refresh procedure in a previous data page modify operation. In this way, each time a new data page modify operation is executed, the refresh procedure restarts from where it has been previously interrupted. Register NV_CNT is non-volatile since the information stored therein is to be preserved even in case a power-down takes place. The volatile counter V_CNT is provided in the memory device for tracking the word lines to be refreshed within a given subset S1–SZ of word lines. In block 202, the content of the non-volatile register NV_CNT is read to determine from which word line the refresh operation shall restart; in particular, referring to FIG. 1, the state machine 8 asserts signal LD to load the word line address counter WL_ADD with the content of the non-volatile register NV_REG. The content the volatile counter V_CNT is instead initialized (the state machine 8 asserts signal RST to set the content of counter V_CNT to, e.g., zero).

In block 203 ("RFR VER") all the memory cells of the first word line of the subset Si (one of subsets S1–SZ) currently under check are submitted to the standard read and the margin read.

In block 204 ("DT OK?") the results of the two types of read are compared to exclude the presence of soft-erased memory cells. Referring to FIG. 1, this operation is for example performed by block CMP.

If soft-erased memory cells are detected in the selected word line (branch "N"), the data stored in such soft-erased memory cells are reinforced (block 205, "CONF DT"), otherwise this last operation is not performed (branch "Y"). For example, referring to FIG. 1, the state machine 8, by asserting signal CONF, instructs the programming circuitry 7 to program the memory cells of the selected word line with the content of volatile register V_REG1.

By assertion of signal INCR, the content of the volatile counter V_CNT and the content of the word line address counter WL_ADD are then incremented by one (block 206, "INC V_CNT INC WL_ADD"), so as to point to the next word line of the subset Si under consideration.

The state machine 8 causes the operations of blocks 203, 204, 205 and 206 to be repeated until all the word lines of the subset Si under consideration have been submitted to the refresh procedure. This situation is detected (block 207, "V_CNT>N") by checking the content of the volatile counter V_CNT: when the content of the volatile counter V_CNT equals N, the number of word lines in the subset Si, all the word lines of the subset under consideration have been checked and the loop exited.

The refresh routine ends after having updated the content of the non-volatile register NV_CNT (block 208, "UPD NV_CNT). The state machine 8 asserts signal ST so that the content of the word line address counter WL_ADD is stored in the non-volatile register NV_REG. In this way, the next time a request to modify the content of a memory page is received by the memory the refresh operation will restart from where it has been suspended, i.e., from the next subset Si of word lines.

The number N of word lines in each subset Z can be for example equal to ¼, ⅛ or 1/16 of the overall number of word lines in the two-dimensional array 1. In this way, each memory cell MC (i.e., each data bit) of the two-dimensional array is checked and, if necessary, reprogrammed every four, eight or, respectively, sixteen operations of data page modification. This makes the refresh method particularly reliable, since before being checked each memory cell will be subject to a maximum number of disturbances equal to four, eight or, respectively, sixteen.

Expediently, the non-volatile counter NV_CNT can be practically implemented by means of one or more dedicated, additional word lines of the two-dimensional array, for example word line RC in FIG. 1. In such dedicated word line, each time the refresh routine 20 is executed one memory cell is programmed (a logic "0" is stored therein), so that the address of the last refreshed subset Si is univocally stored in non volatile way. When all the memory cells of word line RC are programmed, the word line is erased so that all the memory cells thereof return to a logic "1": this indicates that the next refresh routine will start from a pre-selected starting word line (which can be the first physical word line of the two-dimensional array or another word line taken as the starting word line). If there are more than a single word line RC, when all the cells of the first word line RC are programmed the storage of the address of the last refreshed subset Si continues on the following word line RC.

Expediently, word line RC is erased in parallel to another word line of the two-dimensional array during an operation of modification of the content of a memory page. In this way, no delays are introduced that otherwise would reduce the overall time available for performing the refresh routine.

By way of example only, let a memory sector be considered of the size of 0.5 Mbits, arranged as a two-dimensional array of 2048 bit lines and 256 word lines. If it is desired to have a generic memory cell submitted to the refresh procedure every eight data page modify operations, then N=256/8=32, that means that every data page modify operation 32 word lines must be refreshed (for a total of 8 Kbytes of memory) and one memory cell of word line RC used as non-volatile register NV_CNT must be programmed. Since word line RC (which is structurally identical to any other word lines) contains 2048 memory cells, starting from an initial situation of all "1"s, word line RC will thus be entirely programmed after 2048 operations of data page modification: at this time each word line R of the two-dimensional array will have been refreshed 256 times.

It appears that the endurance requirement for the dedicated word line used as non-volatile register does not exceed that imposed on the memory cells MC of the memory pages. In fact, for a typical guaranteed endurance of 100 thousands memory page erase/write cycles, the overall number of erase/write operations is equal to approximately 25.6 millions; since word line RC is erased every 2048/256=256 operations of data page modification, in the 25.6 millions of erase/write operations word line RC will be erased 100 thousands times.

Clearly, the requirements of endurance will vary for arrangements providing for a different number of bit lines and word lines, and/or for different frequencies of refresh of the memory cells. Should this pose problems, then the non-volatile register NV_REG could for example be split onto two or more dedicated word lines like word line RC.

There are several advantages in embedding the non-volatile register NV_REG dedicated to controlling the refresh procedure of the two-dimensional array 1 in the two-dimensional array itself. First of all, it assures an automatic correspondence between the modified data page and the refresh operation controlled by the counter. Secondly, it avoids the necessity of performing read operations on data not belonging to the last addressed memory sector (that is, in memory sectors where no disturbances at all have been applied). Thirdly, it provides distinct word line address non-volatile registers for the various memory sectors practically without any increase in terms of chip area, which would not be possible should all the non-volatile registers be formed in a distinct, dedicated matrix of memory cells. Also, it allows performance of the refresh operation on the non-volatile register itself: this would require to devise a different routine should the non-volatile registers be formed in a distinct matrix of memory cells.

Figure 3:
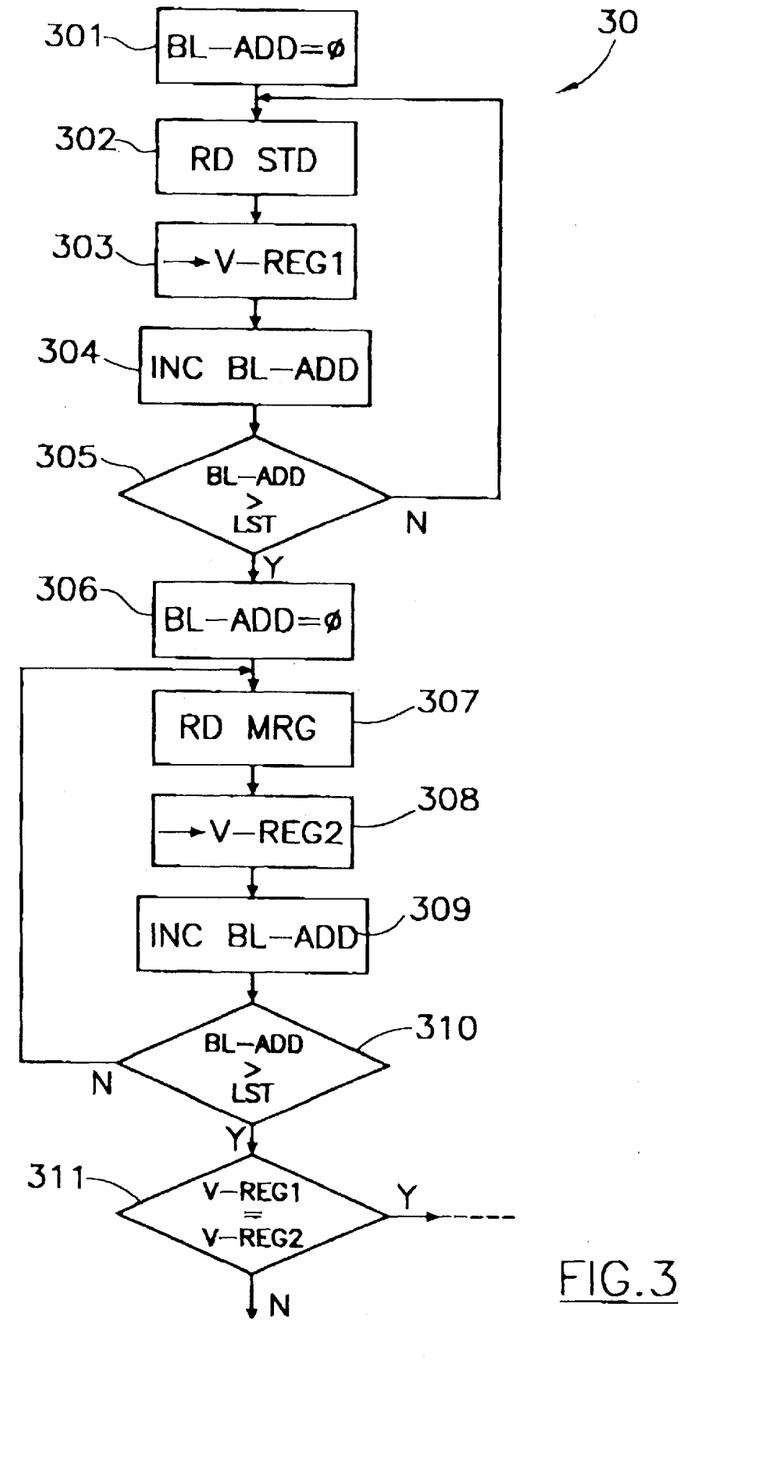
FIGS. 3 and 4 are flowcharts schematically illustrating two alternative subroutines implementing a block of FIG. 2.
Figure 4:
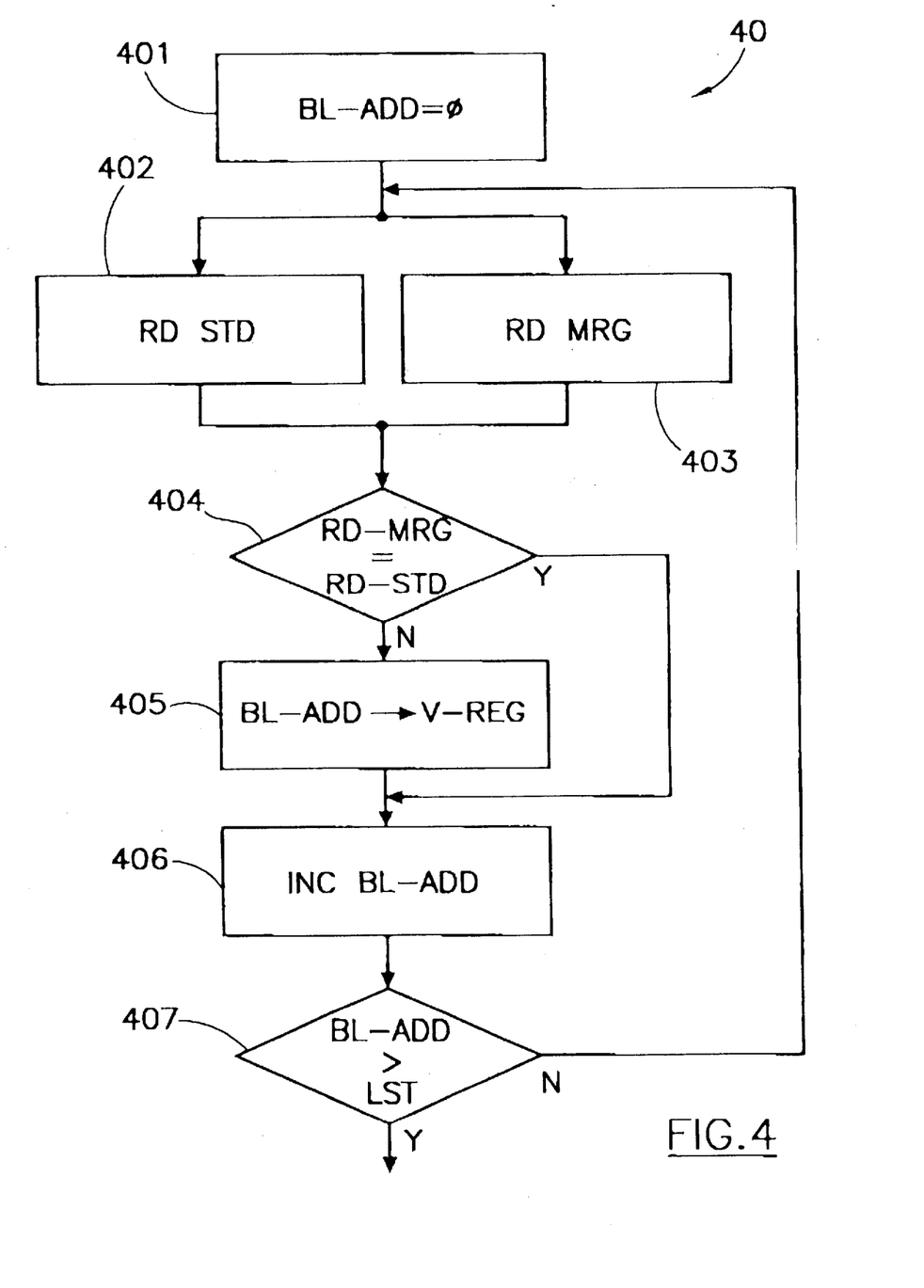

FIGS. 3 and 4 schematically show in terms of flowcharts two alternative implementations of the operations of block 203 of FIG. 2.

More specifically, referring to FIG. 3, the subroutine 30 provides for performing, on each of the N word lines of a given word line subset S1–SZ, a standard read first, followed by a margin read, and then for comparing the results. In block 301 ("BL_ADD=0") the bit line address counter BL_ADD shown in FIG. 1 is set to zero or, more generally, to a starting bit line address. Then (block 302, "RD STD") a standard read is performed of the memory cells belonging to the group of bit lines SC corresponding to the starting bit line address. The result of this standard read is stored in volatile register V_REG1 (block 302, "→V_REG1"), and the bit line address counter BL_ADD increased by one to address the next group SC of bit lines. The standard read goes on until all the memory cells of the current word line have been read (block 305, "BL_ADD>LST", checks the current value of the bit line address counter).

After having completed the standard read, the bit line address counter BL_ADD is again set to zero or to the starting bit line address (block 306, "BL_ADD=0"). A margin read (block 307, "RD MRG") is then performed of the memory cells belonging to the group SC of bit lines corresponding to the starting bit line address. The result of the margin read is stored volatile register V_REG2 (block 308, "→V_REG2") and then the bit line address counter increased by one to address the next group SC of bit lines. The loop ends when all the memory cells of the current word line have been submitted to the margin read.

In order to ascertain if soft-erased memory cells exist in the current word line, the content of volatile register V_REG1 is compared to the content of volatile register V_REG2 (block 311, "V_REG1=V_REG2", that corresponds to block 204 of FIG. 2; logic comparator circuit CMP of FIG. 1). The two volatile registers V_REG1 and V_REG2 can comprise each a number of latches equal to the number of bits of a generic word line. The latches of the two volatile registers V_REG1, V_REG2 that correspond to a same bit of the word line are compared; if each pair of latches contains the same datum, then no soft-erased memory cells exist on the addressed word line, and it is not necessary to confirm, ie. reprogram, the datum. If instead the content of a pair of corresponding latches of the two volatile registers V_REG1, V_REG2 differs, in the sense that the latch of register V_REG1 is a logic "0" while the corresponding latch of register V_REG2 is a logic "1", then the corresponding memory cell of the addressed word line has partially lost charge and must be reprogrammed (situation MC2 in FIG. 2A).

The comparison of the corresponding pairs of latches of the two volatile registers V_REG1, V_REG2 can be quite fast, since it can be carried out by means of simple logic gates. A logically complemented XOR operator provides the correct logical operator.

Clearly, it is not strictly necessary that the standard read precedes the margin read: the two reads can be performed in any order.

Figures 3A, 4A:
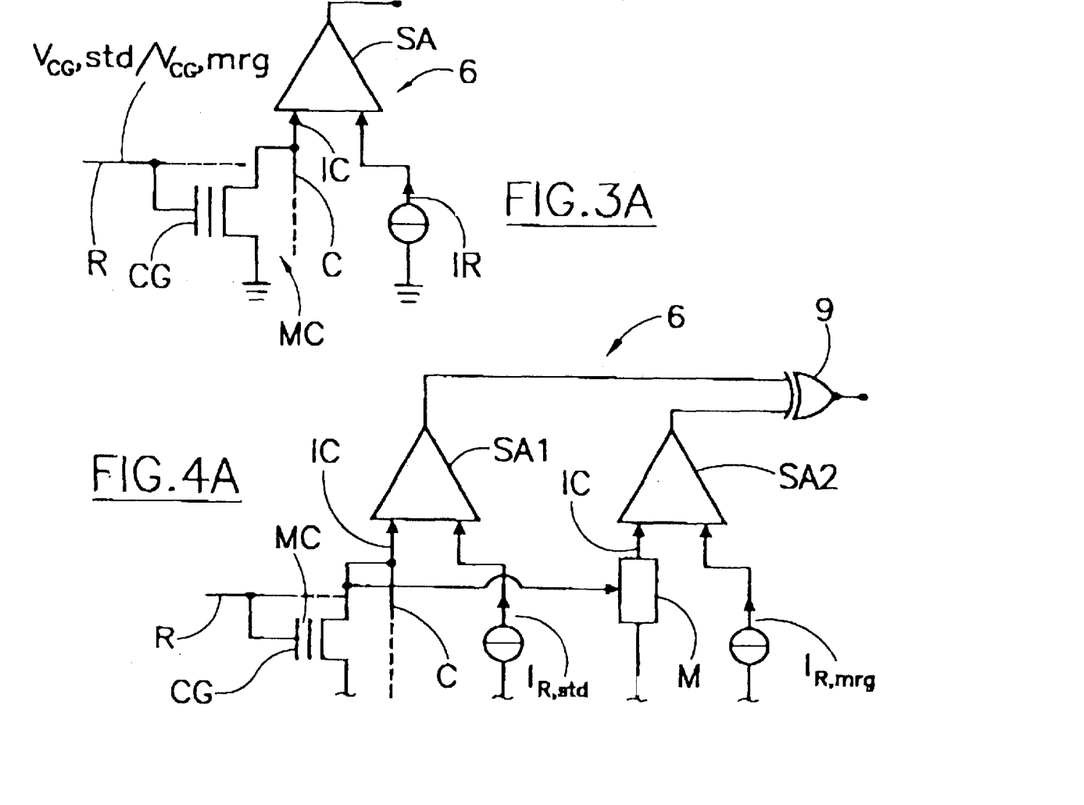
FIGS. 3A and 4A schematically show circuit arrangements suitable for implementing the alternative subroutines of FIGS. 3 and, respectively, 4.

As schematically shown in FIG. 3A, in the subroutine of FIG. 3 only one sense amplifier SA is necessary to perform the two reads on a given memory cell. In order to perform the margin read, circuit 4 can bias the selected word line R, thus the control gate CG of the memory cell, to a voltage $V_{CG,mrg}$ suitably higher than the biasing voltage $V_{CG,std}$ of the same word line in the standard read. In this way, two different control gate voltages are applied to the memory cells of the addressed word line: a lower control gate voltage in standard read, a higher control gate voltage in margin read. The sense amplifier SA then compares a current $I_C$ sunk by the memory cell in the two biasing conditions to a reference current $I_R$.

The alternative subroutine 40 of FIG. 4 allows for a faster operation than that of FIG. 3, but requires more sense amplifiers (twice the number required by the routine of FIG. 3) to be provided for in the sensing circuitry 6. The standard and margin reads are performed simultaneously, by simultaneously comparing a characteristic quantity of any given memory cells of the addressed word line, for example the current sunk by such memory cell, to two different reference quantities, for example two reference currents, one reference current for the standard read and the other for the margin read. Referring jointly to FIG. 4A, for sensing a given memory cell two sense amplifiers SA1, SA2 are required, one SA1 supplied with the memory cell current $I_C$ and the standard read reference current $I_{R,std}$, the other SA2 supplied with the memory cell current $I_C$ and the margin read reference current $I_{R,mrg}$. In practice, the current $I_C$ sunk by an addressed memory cell can be mirrored (block M in FIG. 4A) and supplied to the two sense amplifiers SA1, SA2 to be compared to the two reference currents.

At the beginning of subroutine 40, the bit line address counter BL_ADD is again set to zero or, generally, to a starting value (block 401, "BL_ADD 0"). Then, the standard and margin reads are carried out in parallel (blocks 402, "RD STD", and 403, "RD MRG"). The results of the two reads (that is, for each addressed memory cell, the outputs of the two sense amplifiers SA1, SA2) are then compared (block 404, "RD_MRG =RD_STD"); if they differ, the bit line address (contained in the bit line address counter) is stored in a volatile register V_REG (block 405, "BL_ADD→V_REG"), for example a register of the state machine 8. The bit line addresses stored in the volatile register V_REG are used by the programming circuitry 7 for the subsequent operation of reinforcing the datum.

The bit line address counter BL_ADD is then increased by one and the previous operations performed on the memory cells of the next group SC of bit lines. The loop ends when all the groups of bit lines have been checked (block 407, "BL_ADD>LST").

The routine of FIG. 4 does not require the provision of the two volatile registers V_REG1, V_REG2: the comparison of the results of the standard and margin reads is performed directly at the output of the sense amplifiers (for example by complemented XOR logic gates 9 as schematized in FIG. 4A).

As a result of the data refresh method of FIG. 3, it is possible to check and, if necessary, reinforce all the data stored in the memory cells of the two-dimensional array 1 with a prescribed frequency.

The described method can be implemented in a substantially transparent way for the user. Typically, the time required for erasing a memory page ranges from 5 to 10 ms, and that for programming the memory page with the new data ranges from 3 to 5 ms (supposing a memory page made up of 256 Bytes, as in the above example). Assuming N=16 or 32, the time required for performing the standard read and the margin read is not higher than 1 or 2 ms, while the time for re-programming the detected soft-erased memory cells amounts to approximately 5 µs per memory cell. Since for a PEROM 20 ms are a reasonable characteristic time which can be guaranteed to the user for performing a data page modify operation (this time is one of the guaranteed features specified in the memory data sheet), it follows that the refresh procedure can be executed within the guaranteed, characteristic time in a way transparent to the user.

It is to be noted that the standard read and the margin read can be fast, sequential reads, since once a word line is selected and properly biased, it is only necessary to sequentially increase the bit line address counter (no time is wasted in discharging the capacitor associated to one word line and charging that associated to another word line, as in a random-access read).

It is also to be noted that albeit in the previous description the data page modify operation always precedes the data refresh routine, this is not limitative to the present invention. It could as well be envisaged that, as soon as the memory receives a request to modify a data page, the refresh routine is executed first, and then the content of the addressed memory page is modified.

Figure 5:
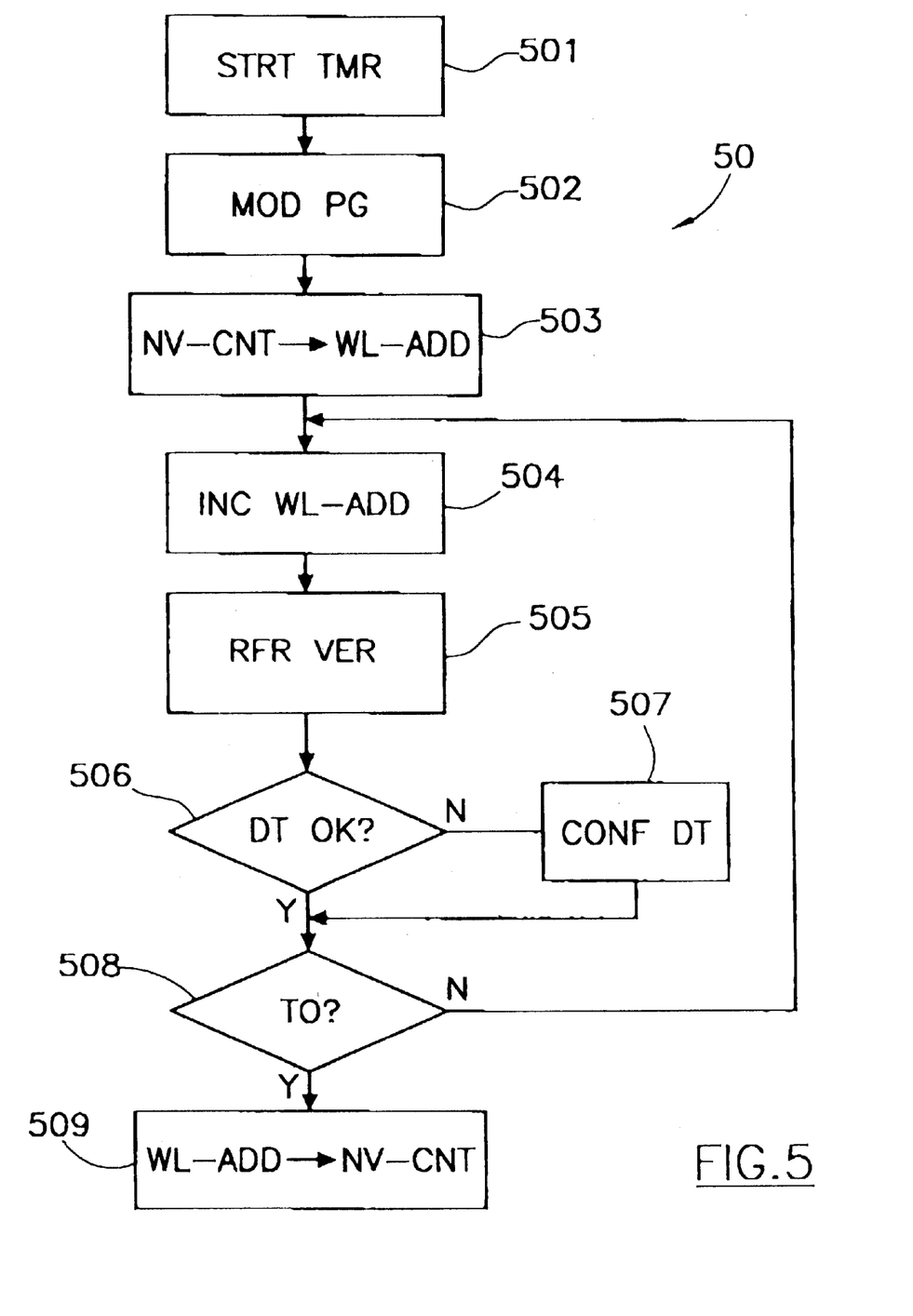
FIG. 5 is a flowchart schematically illustrating a second, preferred embodiment of the method according to the present invention.

In FIG. 5 another, preferred embodiment of the present invention is shown. In this embodiment, as soon as the memory receives a data page modify request, a memory internal timer (TMR in FIG. 1) is started (block 501, "STRT TMR"). The internal timer TMR has the function of measuring the time lapsed from the beginning of the data page modify operation.

The content of the addressed memory page is then modified (block 502, "MOD PG", corresponding to block 201 of FIG. 2). At the end of this operation, the content of the non-volatile register NV_REG is read and loaded into the word line address counter WL_ADD (block 503, "NV_REG→WL_ADD"). The non-volatile register NV_REG is used to store the address of the last word line which, in a previous data refresh operation, has been subjected to the refresh procedure. The content of the word line address counter WL_ADD is incremented by one, to point to the first word line which must be submitted to the refresh routine (block 504, "INC WL_ADD"). The addressed word line is then subjected to the refresh routine (block 505, "RFR VER"), which can for example be the routine described in connection with FIG. 3 or the one of FIG. 4. The existence of soft-programmed memory cells is then checked (block 506, "DT OK?") and, if necessary, the detected soft-erased memory cells are reprogrammed (block 507, "CONF DT").

After this, the memory internal timer TMR is checked to ascertain if there is enough time left for performing the refresh verify on another, subsequent word line (block 508, "TO?"). This is done by comparing the content of the internal timer TMR, that is a measure of the time lapsed from the beginning of the data page modify operation, with a maximum allowed lapsed time TO. Preferably, the latter substantially corresponds to the memory characteristic time guaranteed for completing a data page modify operation, minus the maximum estimated time necessary for performing a complete refresh operation on a word line. If sufficient time remains for submitting the next word line to the refresh operation, the routine loops back to block 504: the word line address counter WL_ADD is incremented by one to point to the next word line. Otherwise, the content of the word line address counter WL_ADD is stored in the non-volatile register NV_REG and the refresh routine ends.

It is to be noted that in block 509 it is not strictly necessary to store each time the exact word line address in the non-volatile register NV_CNT. In fact, let it be supposed that the set of word lines R of the two-dimensional array 1 is ideally subdivided in subsets of, for example, four, eight or sixteen word lines (such as the subsets S1–SZ of FIG. 1), and that only a portion of a word line address identifying the subset to which the word line belongs is stored in the non-volatile register NV_REG. Then, if the maximum allowed time TO is reached before the refresh procedure has been completed on the current subset of word lines, that is, the refresh procedure is interrupted within a given subset of word lines, then the next time the refresh procedure is executed (i.e., the next time a data page modify request is received by the memory) the same subset of word lines will still be selected; the first word lines of the selected subset will thus be refreshed again, but this does not cause any problem provided that, as it usually is, the time available in a data page modify operation is sufficiently long to allow standard and margin reads and, if necessary, memory cell reprogramming to be performed on four, or eight or sixteen word lines; moreover, the memory cells of the first word line of the selected subset are expected not to have partially lost the charge because they were refreshed after the previous step of data page modification and correspondingly have been disturbed only once.

Figure 6:
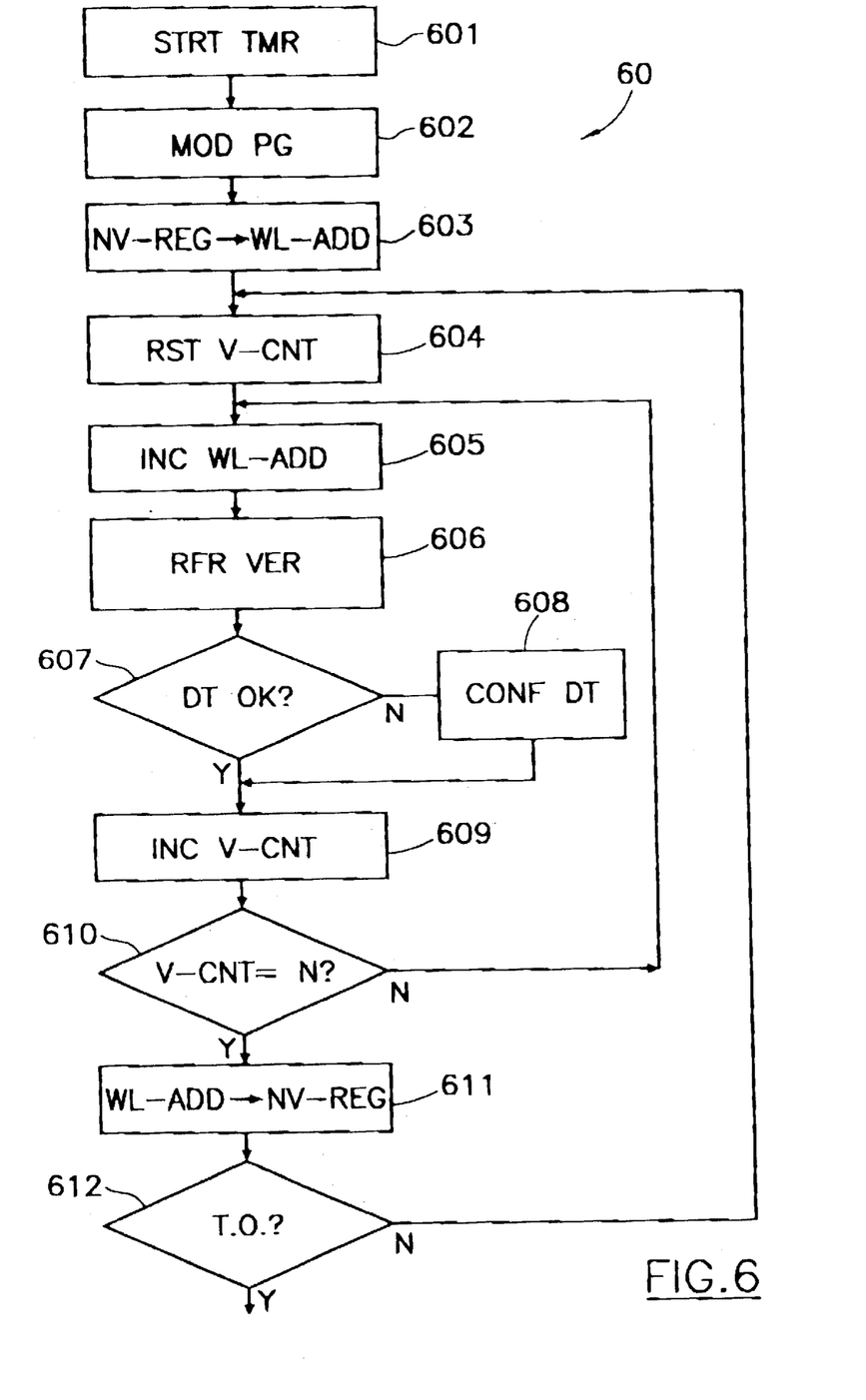
FIG. 6 is a flowchart schematically illustrating a third embodiment of the method according to the invention.

An alternative to the embodiment of FIG. 5 is shown in FIG. 6. In this embodiment, as in the one of FIG. 2, the set of word lines R of the two-dimensional array 1 is ideally subdivided in Z subsets S1–SZ, preferably of N word lines each.

Again, as soon as the memory receives a data page modify request, the memory internal timer TMR is started (block 601, "STRT CLK"). Then, the data page modify operation is carried out (block 602, "MOD PG"). Once this operation is completed, the content of the non-volatile register NV_CNT is read and stored in the word line address counter WL_ADD (block 603, NV_CNT→WL_ADD"). A volatile counter, for example the volatile counter V_CNT shown in FIG. 1, is initialized (block 604, "RST V_CNT"), then the word line address counter WL_ADD is incremented by one (block 605, "INC WL_ADD") to point to the first word line to be submitted to the refresh procedure. The refresh routine is then carried out on the addressed word line (block 606, "RFR VER"), for example according to any one of the two alternatives of FIGS. 3 and 4. The existence of soft-erased memory cells in the addressed word line is then checked (block 607, "DT OK?") and, in the affirmative, the soft-erased memory cells are reprogrammed (block 608, "CONF DT"). The volatile counter V_CNT is then incremented by one (block 609, "INC V_CNT").

After this, the content of the volatile register V_CNT is checked to ascertain if all the N word lines of the subset have been refreshed (block 610, "V_CNT=N?"). If not, the routine loops back to block 605, and the next word line of the subset is verified; if yes, the content of the word line address counter WL_ADD is stored in the non-volatile register NV_REG (block 611, "WL_ADD→NV_CNT").

The internal timer TMR is then checked to ascertain if there is enough time left for performing the refresh procedure on another, subsequent subset of word lines (block 612, "TO?").

In other words, in the alternative embodiment of FIG. 6 the comparison between the time lapsed from the beginning of the data page modify operation and the available, overall time is done only after a subset of (e.g., four, eight or sixteen) word lines has been submitted to the refresh procedure. If it is ascertained that there is no sufficient time left for carrying out the refresh operation on another subset of word lines, the portion of the word line address defining the subset of word lines is stored in the non-volatile register NV_REG. The volatile counter V_CNT is necessary in this case to point to one word line at a time among those of a current subset.

Also in this case, it is expedient to implement the non-volatile register NV_REG by using one (or more) additional, dedicated word line of the two-dimensional array 1 (memory sector), such as word line RC of FIG. 1. The memory cells of this word line are initially all non-programmed (all logic "1"s). At the end of each refresh procedure of a subset of N word lines, one memory cell of the dedicated word line is programmed ("0"). When all the memory cells of the dedicated word line are programmed, the dedicated word line can be erased. By way of example, let a memory sector be considered of the size of 0.5 Mbits, arranged as a two-dimensional array of 2048 bit lines and 256 word lines. Assuming that each subset contains N=16 word lines, each time the whole memory sector has been verified then 256/16=16 memory cells of the dedicated word line are programmed, that means that before the dedicated word lines is completely programmed the memory sector has been completely verified 2048/16=128 times. At this time, the dedicated word line can be erased or, if more than one dedicated, additional word lines are used to implement the non-volatile register, another word line is used.

In any case, even with only one dedicated word line, the latter becomes "full" (all memory cells thereof programmed)

after at least 128 operations of modification of a memory page. This number can even be higher if the refresh operation can be carried out on the whole memory sector before the intervention of the time out: in this case, the refresh procedure can be interrupted without modifying the content of the non-volatile register, which already contains the information necessary to identify the word line from which the refresh procedure will start the next time a data page modify request is received by the memory. In this way the lifetime of the dedicated word line is augmented.

For the above reasons, the requirements of endurance for the dedicated word line used as non-volatile register NV_REG are practically equivalent to those for the other word lines of the two-dimensional array.

Thanks to the method according to the preferred embodiment of the invention, the memory cells of the two-dimensional array (memory sector) can be submitted to a data refresh operation with the maximum frequency allowed by the specified, guaranteed page modify time, and in a way completely transparent for the user. In occasion of each data page modify operation, the maximum possible number of word lines are subjected to a check for detecting the presence of soft-erased memory cells and, if some of the latter are present, the datum is reinforced.

The algorithm is self-adaptive with respect to the pattern of "1"s and "0"s in the new data page to be substituted for the previously stored one. As known, the less "0"s exist in a data page to be written, the shorter the data page writing time and the longer the time available for the refresh procedure. The algorithm is also self-adaptive with respect to the possible lengthening of the erase time due to aging: with time, charges are trapped in the gate oxides of the memory cells so that the time necessary for extracting charges from the floating gates increases. This causes a lengthening of the time necessary to erase the memory page, and reduces the time available to perform the refresh procedure. Thanks to these self-adaptiveness, the method always provides the best result possible.

As already mentioned, the time typically required for erasing a memory page ranges from 5 to 10 ms, and that for programming the memory page with the new data ranges from 3 to 5 ms (supposing a memory page made up of 256 Bytes, as in the above example). Since for a PEROM 20 ms are a reasonable spec to be guaranteed to the user for completing a data page modify operation, it follows that from 5 to 12 ms are left for carrying out the refresh operation. Considering that the time required for performing the standard read and the margin read is not higher than 1 ms (for sixteen word lines), and that the time for re-programming the detected soft-erased memory cells amounts to approximately 5 µs per memory cell, it can easily be seen that at each data page modify operation a portion ranging from ½ to ¾ of the two-dimensional array can be verified. Even a slight increase in the sensing speed in the standard and margin reads could easily allow to achieve the goal of verifying the whole two-dimensional array at each data page modify operation.

Even if in the previous description reference has always been made to erasure of one (or more) rows of the two-dimensional array, the invention applies in general whenever a portion of the two-dimensional array of memory cells, for example a portion of a memory sector, can be individually erased.

Thanks to the periodicity of the refresh operation, the method according to the invention allows to overcome problems of data loss of any nature, not only caused by disturbances induced on the memory cells during erasure of other memory cells, but also due to scarce data retention.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for refreshing data stored in an electrically erasable and programmable non-volatile semiconductor memory comprising at least one array of memory cells including a plurality of individually erasable and programmable memory pages, the method comprising:

each time a request to modify a content of a memory page is received by the memory, modifying the content of the memory page and submitting a portion of the array to a refresh procedure;

the refresh procedure comprising detecting memory cells that have at least partially lost respective data stored therein and reprogramming the data in the detected memory cells;

wherein detecting memory cells that have at least partially lost respective data stored therein comprises reading memory cells in a standard read condition and in a margin read condition, the margin read condition comprising reading at least one critical memory cell and being a more stringent read condition compared to the first read condition; and wherein reading memory cells in the standard read condition and in the margin read condition comprises performing a single sensing of each memory cell, and comparing a characteristic quantity of a respective memory cell with two different prescribed reference quantities comprising a first reference quantity defining a standard reference quantity and a second reference quantity defining a margin reference quantity.

2. A method according to claim 1 wherein the margin read condition is a read condition for verifying a programmed status of a memory cell in an electrical programming operation.

3. A method according to claim 1 wherein reading memory cells in the standard read condition and in the margin read condition comprises performing a first sensing and a second sensing of each memory cell at different times and in different memory cell biasing conditions.

4. A method according to claim 1 wherein performing a single sensing of each memory cell and comparing a characteristic quantity of a respective memory cell with two different prescribed reference quantities comprises biasing the respective memory cell in a prescribed condition and comparing a respective memory cell current with two different prescribed reference currents comprising a first reference current for discriminating whether the respective memory cell stores a first or a second logic value in the standard read condition, and a second reference current for discriminating whether the respective memory cell stores a first or a second logic value in the margin read condition.

5. A method for refreshing data stored in an electrically erasable and programmable non-volatile semiconductor memory comprising at least one array of memory cells including a plurality of individually erasable and programmable memory pages, the method comprising:

each time a request to modify a content of a memory page is received by the memory, modifying the content of the memory page and submitting a portion of the array to a refresh procedure;

the refresh procedure comprising detecting memory cells that have at least partially lost respective data stored therein and reprogramming the data in the detected memory cells;

wherein memory cells of the at least one array are arranged in rows and columns;

wherein the memory page includes at least one row; and wherein the portion of the at least one array submitted to the refresh procedure comprises a group of rows;

wherein after a group of rows has been submitted to the refresh procedure an address indicator of a last row of the group is stored in a non-volatile condition in the memory.

6. A method according to claim 5 wherein the group of rows comprises one of a plurality of subsets of rows of the at least one array of memory cells and further comprises a pre-selected number of rows.

7. A method according to claim 6 wherein the pre-selected number of rows comprises more than one row.

8. A method according to claim 7 comprising before submitting one of the plurality of subsets of rows to the refresh procedure, retrieving address information of a last subset of rows previously submitted to the refresh procedure, the address information stored in a non-volatile condition in the memory; and further comprising, before terminating the refresh procedure, storing in a non-volatile condition updated address information for subsets of rows submitted to the refresh procedure.

9. A method according to claim 5 wherein the group of rows comprises a variable number of rows.

10. A method according to claim 9 wherein the variable number of rows is based on a performing time for performing the refresh procedure, the performing time corresponding to a difference between a memory characteristic time for an operation for modifying the content of a memory page and an elapsed time corresponding to a time actually elapsed in performing the operation.

11. A method according to claim 10 comprising:
(a) when the request to modify the content of a memory page is received, starting a memory internal timer;
(b) modifying the content of a memory page;
(c) submitting at least one row of the array to the refresh procedure;
(d) checking the memory internal timer to determine a remaining time before the memory characteristic time is reached; and
(e) if the remaining time permits, repeating steps (c) and (d), and otherwise terminating the refresh procedure.

12. A method according to claim 11 in which steps (c) and (d) comprise submitting one row to the refresh procedure and then checking the memory internal timer to determine whether the remaining time permits performing the refresh procedure on another row.

13. A method according to claim 12 wherein step (e) further comprises before terminating the refresh procedure, storing in a non-volatile condition an address indicator of the last row submitted to the refresh procedure; and wherein step (c) further comprises retrieving the address indicator stored in a non-volatile condition.

14. A method according to claim 12 wherein steps (c) and (d) comprise submitting a subset of rows comprising a plurality of rows of the at least one array to the refresh procedure and then checking the internal memory timer to determine whether the remaining time permits performing the refresh procedure on a different subset of rows.

15. A method according to claim 14 wherein step (e) further comprises, before terminating the refresh procedure, storing in a non-volatile condition an address indicator of at least a last subset of rows submitted to the refresh procedure; and wherein step (c) further comprises retrieving the address indicator.

16. A method for refreshing data stored in an electrically erasable and programmable non-volatile semiconductor memory comprising at least one array of memory cells arranged in rows and columns, the at least one array including a plurality of individually erasable and programmable memory pages, each memory page comprising at least one row of memory cells, the method comprising:

each time a request to modify a content of a memory page is received by the memory, modifying the content of the memory page and submitting a portion of the array to a refresh procedure;

the refresh procedure comprising detecting memory cells that have at least partially lost respective data stored therein and reprogramming the data in the detected memory cells;

wherein detecting memory cells that have at least partially lost respective data stored therein comprises reading memory cells in a standard read condition and in a margin read condition, the margin read condition comprising reading at least one critical memory cell and being a more stringent read condition compared to the first read condition; and wherein reading memory cells in the standard read condition and in the margin read condition comprises performing a first sensing and a second sensing of each memory cell at different times and in different memory cell biasing conditions.

17. A method according to claim 16 wherein the margin read condition is a read condition for verifying a programmed status of a memory cell in an electrical programming operation.

18. An electrically programmable and erasable non-volatile semiconductor memory comprising:

at least one array of memory cells, said at least one array including a plurality of individually erasable and programmable memory pages; and a circuit responsive to a request received by the memory to modify a content of a memory page, said circuit submitting a portion of the at least one array to a refresh procedure each time a request is received by the memory;

said circuit comprising a state machine and including
detecting circuitry for detecting memory cells of said portion of the at least one array that have at least partially lost data stored therein, and
reprogramming circuitry for reprogramming data at least partially lost in the detected memory cells;

said detecting circuitry comprising
read circuitry for reading memory cells belonging to said portion in a first read condition and in a second read condition, the second read condition comprising a more stringent memory cell read condition as compared to the first read condition, and
comparison circuitry for comparing results of reading in the first and second read conditions,
said read circuitry comprising for each memory cell to be read, a sense amplifier circuit to operate under the first and second read conditions at different times of the refresh procedure, and first and second registers for at least temporarily storing results of reading in the first and second read conditions, said comparison circuitry comparing results based on content of said first and second registers.

19. A memory according to claim 18 further comprising:

an internal timer activated by said state machine upon receipt of the request to modify content of a memory page to thereby measure a time elapsed therefrom; and timing circuitry for comparing the time elapsed to a maximum time for performing the request;

the refresh procedure being interrupted when the time elapsed is within a predetermined margin of the maximum time.

20. An electrically programmable and erasable non-volatile semiconductor memory comprising:

at least one array of memory cell, said at least one array including a plurality of individually erasable and programmable memory pages; and a circuit responsive to a request received by the memory to modify a content of a memory page, said circuit submitting a portion of the at least one array to a refresh procedure when a request is received by the memory;

said circuit comprising a state machine and including detecting circuitry for detecting memory cells of said portion of the at least one array that have at least partially lost data stored therein, and reprogramming circuitry for reprogramming data at least partially lost in the detected memory cells;

said detecting circuitry comprising read circuitry for reading memory cells belonging to said portion in a first read condition and in a second read condition, the second read condition comprising a more stringent memory cell read condition as compared to the first read condition, and comparison circuitry for comparing results of reading in the first and second read conditions, wherein said read circuitry comprises for each memory cell to be read, two sense amplifier circuits for simultaneously performing readings in the first and second read conditions, respectively, said comparison circuitry comparing outputs of said two sense amplifier circuits.

21. A memory according to claim 20 further comprising:

an internal timer activated by said state machine upon receipt of the request to modify content of a memory page to thereby measure a time elapsed therefrom; and timing circuitry for comparing the time elapsed to a maximum time for performing the request;

the refresh procedure being interrupted when the time elapsed is within a predetermined margin of the maximum time.

22. An electrically programmable and erasable non-volatile semiconductor memory comprising:

at least one array of memory cells, said at least one array including a plurality of individually erasable and programmable memory pages;

a circuit responsive to a request received by the memory to modify a content of a memory page, said circuit submitting a portion of the at least one array to a refresh procedure each time a request is received by the memory;

said circuit including detecting circuitry for detecting memory cells of said portion of the at least one array that have at least partially lost data stored therein, and reprogramming circuitry for reprogramming data at least partially lost in the detected memory cells; and at least one non-volatile register for storing an address indicator in a non-volatile condition, said address corresponding to the last portion of the at least one array submitted to the refresh procedure, wherein said at least one non-volatile register comprises at least one memory cell of said at least one array.

* * * * *